US012562686B2

(12) United States Patent
Mourant

(10) Patent No.: US 12,562,686 B2
(45) Date of Patent: Feb. 24, 2026

(54) BALANCED MIXER

(71) Applicant: MACOM Technology Solutions Holdings, Inc., Lowell, MA (US)

(72) Inventor: Jean-Marc Mourant, Lowell, MA (US)

(73) Assignee: MACOM Technology Solutions Holdings, Inc., Lowell, MA (US)

(*) Notice: Subject to any disclaimer, the term of this patent is extended or adjusted under 35 U.S.C. 154(b) by 19 days.

(21) Appl. No.: 18/236,093

(22) Filed: Aug. 21, 2023

(65) Prior Publication Data

US 2025/0070716 A1     Feb. 27, 2025

(51) Int. Cl.
*H03D 7/12*      (2006.01)
*H03H 7/06*      (2006.01)

(52) U.S. Cl.
CPC .............. *H03D 7/125* (2013.01); *H03H 7/06* (2013.01)

(58) Field of Classification Search
CPC .. H03D 7/06; H03D 7/08; H03D 7/10; H03D 7/12; H03D 7/125; H03D 7/14; H03D 7/1416; H03D 7/1425; H03D 7/1441; H03D 7/1458; H03D 7/1466; H03D 7/1483; H03D 2200/009; H03H 7/01; H03H 7/06; H03H 7/065; H03H 7/07
See application file for complete search history.

(56) References Cited

U.S. PATENT DOCUMENTS

| | | | |
|---|---|---|---|
| 5,697,092 A | 12/1997 | Mourant et al. | |
| 5,886,589 A | 3/1999 | Mourant | |
| 6,064,872 A * | 5/2000 | Vice ..................... | H03D 7/1441 |
| | | | 455/333 |
| 6,687,494 B1 | 2/2004 | Mourant | |
| 7,580,693 B2 | 8/2009 | Rohde et al. | |
| 7,962,114 B2 * | 6/2011 | Garcia ................. | H03D 7/1475 |
| | | | 455/333 |
| 11,158,941 B2 * | 10/2021 | Hickle ................. | H03D 7/1441 |
| 2009/0111394 A1 * | 4/2009 | Vajha ................... | H03B 5/1852 |
| | | | 455/90.2 |

OTHER PUBLICATIONS

Extended European Search Report for Europe Patent Application No. 24192199.8, dated Oct. 10, 2025, 10 pages.

* cited by examiner

*Primary Examiner* — Long Nguyen
(74) *Attorney, Agent, or Firm* — Sheridan Ross P.C.

(57) ABSTRACT

Systems, circuits, and methods for mixing signals are provided. An illustrative circuit may include mixer circuitry including multiple inputs and at least one output, where the multiple inputs are connected across a local oscillator. The circuit may further include a terminal Radio Frequency (RF) output circuitry that is isolated from the local oscillator, where the at least one output of the mixer circuitry is directly connected to an input of the terminal RF output circuitry. The circuit may further include terminal Intermediate Frequency (IF) output circuitry that is isolated from the local oscillator, where the at least one output of the mixer circuitry is directly connected to an input of the terminal IF output circuitry.

20 Claims, 4 Drawing Sheets

BALANCED MIXER

FIELD OF THE DISCLOSURE

The present disclosure is generally directed toward circuits and, in particular, toward mixer circuits.

BACKGROUND

Communication systems have evolved to support much higher bandwidths over time. To support increased bandwidth, radio architectures have changed from super heterodyne to zero Intermediate Frequency (IF) or direct sampling. In other low-bandwidth applications, however, mixing to a low frequency can be the most power efficient approach. Either the carrier frequency is low (e.g., in ultrasound imaging) or it is down converted to a lower frequency for easier processing (e.g., in Magnetic Resonance Imaging (MRI) systems).

The MRI signal has low bandwidth (e.g., less than 1 MHz), but the dynamic range is large, requiring low noise, low gain, and low intermodulation. Because of the large magnetic fields used in MRI imaging, the signal has to be carried on shielded cables that can be lossy at higher MRI frequencies (e.g., at frequencies between 65 MHz and 300 MHz). Down converting to low IF may decreases losses.

SUMMARY

Embodiments of the present disclosure are contemplated to improve the performance of circuits used for mixing within a low-bandwidth application. Illustratively, and without limitation, embodiments of the present disclosure contemplate circuits and/or systems for use in mixing signals obtained from an MRI imaging system.

There are two main families of mixers. Active mixers whereby a small transistor can switch a bias current and passive mixers whereby the input Radio Frequency (RF) signal is switched by a diode of a transistor. Active mixers are easier to integrate but have worse linearity and noise.

Passive mixers, on the other hand, tend to dominate the field of high dynamic range, low power applications. By separating the switching action and the Local Oscillator (LO) signal amplification, passive mixers can operate each function more efficiently. Important aspects of mixer performance include low conversion loss, high linearity, and high isolation between the ports. When the mixer is passive, isolation is hard to achieve, but it is important to avoid spurious responses in the radio or to provide image rejection.

Among passive mixers, either transistors, such as Field Effect Transistors (FETs), or diodes are used as switching elements. FET mixers dominate the lower frequencies where they have significantly better linearity and efficiency. Diode mixers dominate the higher frequencies, because the diodes have inherently more bandwidth than FETs.

Embodiments of the present disclosure contemplate a mixer circuit for use in processing lower frequencies, but can also be used to process higher frequencies. Embodiments of the present disclosure further contemplate the use of a FET-based passive mixer. Existing FET-based mixer circuits that exhibit excellent performance (e.g., low conversion loss along with good isolation and linearity) do so at the cost of increased complexity and the use of up to three baluns at the LO, RF and IF frequencies. Embodiments of the present disclosure contemplate a FET-based mixer circuit that does not require any baluns, but instead is constructed solely of passive components. The mixer circuit contemplated herein exhibits increased performance without increased complexity.

In some embodiments, a circuit is provided that includes: mixer circuitry having multiple inputs and at least one output, where the multiple inputs are connected across a local oscillator; terminal RF output circuitry that is isolated from the local oscillator, where the at least one output of the mixer circuitry is directly connected to an input of the terminal RF output circuitry; and terminal IF output circuitry that is isolated from the local oscillator, where the at least one output of the mixer circuitry is directly connected to an input of the terminal IF output circuitry.

In some embodiments, a system is provided that includes: a local oscillator; a mixer having a first input, a second input, and at least one output, where the first input and the second input are both connected to the local oscillator; and one or more output circuits connected to the at least one output of the mixer, where the one or more output circuits are isolated from the local oscillator, and where the one or more output circuits extract one or both of RF components and IF components from the at least one output of the mixer.

In some embodiments, a method is provided that includes: connecting a mixer across a local oscillator; connecting a first output circuit directly to an output of the mixer; connecting a second output circuit directly to the output of the mixer; enabling the first output circuit to extract RF components from the output of the mixer; enabling the second output circuit to extract IF components from the output of the mixer; and isolating both the first output circuit and the second output circuit from the local oscillator using passive components.

The preceding is a simplified summary to provide a basic understanding of some aspects and embodiments described herein. This summary is not an extensive overview of the disclosed subject matter. It is neither intended to identify key nor critical elements of the disclosure nor delineate the scope thereof. The summary is provided to present some concepts in a simplified form as a prelude to the more detailed description that is presented later.

BRIEF DESCRIPTION OF THE DRAWINGS

The present disclosure is described in conjunction with the appended figures, which are not necessarily drawn to scale.

DETAILED DESCRIPTION

It is with respect to the above-noted challenges that embodiments of the present disclosure were contemplated. In particular, a system, circuits, and method of operating such circuits are provided that solve the drawbacks associated with existing mixer circuits.

While embodiments of the present disclosure will primarily be described in connection with mixer circuits used in low-bandwidth applications, it should be appreciated that embodiments of the present disclosure are not so limited. Furthermore, while embodiments of the present disclosure are contemplated for use in mixing MRI imaging signals, it should be appreciated that embodiments of the present disclosure are not so limited.

Various aspects of the present disclosure will be described herein with reference to drawings that are schematic illustrations of idealized configurations. It should be appreciated that while particular circuit configurations and circuit elements are described herein, embodiments of the present disclosure are not limited to the illustrative circuit configurations and/or circuit elements depicted and described herein. Specifically, it should be appreciated that circuit elements of a particular type or function may be replaced with one or multiple other circuit elements to achieve a similar function without departing from the scope of the present disclosure.

It should also be appreciated that the embodiments described herein may be implemented in any number of form factors. Specifically, the entirety of the circuits disclosed herein may be implemented in silicon as a fully-integrated solution (e.g., as a single Integrated Circuit (IC) chip or multiple IC chips) or they may be implemented as discrete components connected to a Printed Circuit Board (PCB).

Figure 1A:
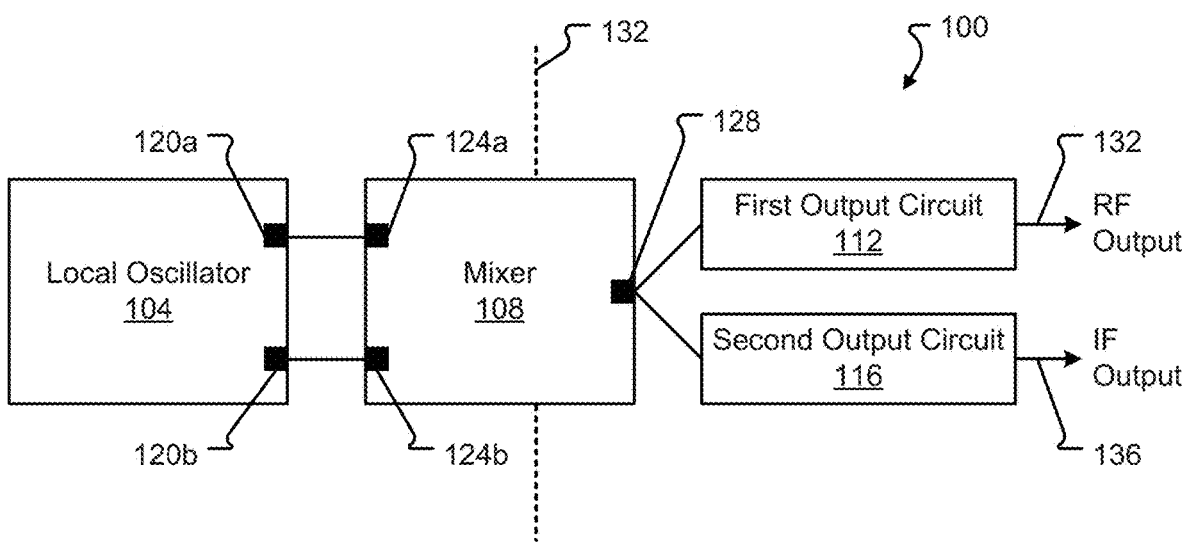
FIG. 1A is a block diagram illustrating a system according to at least some embodiments of the present disclosure.
Figure 1B:
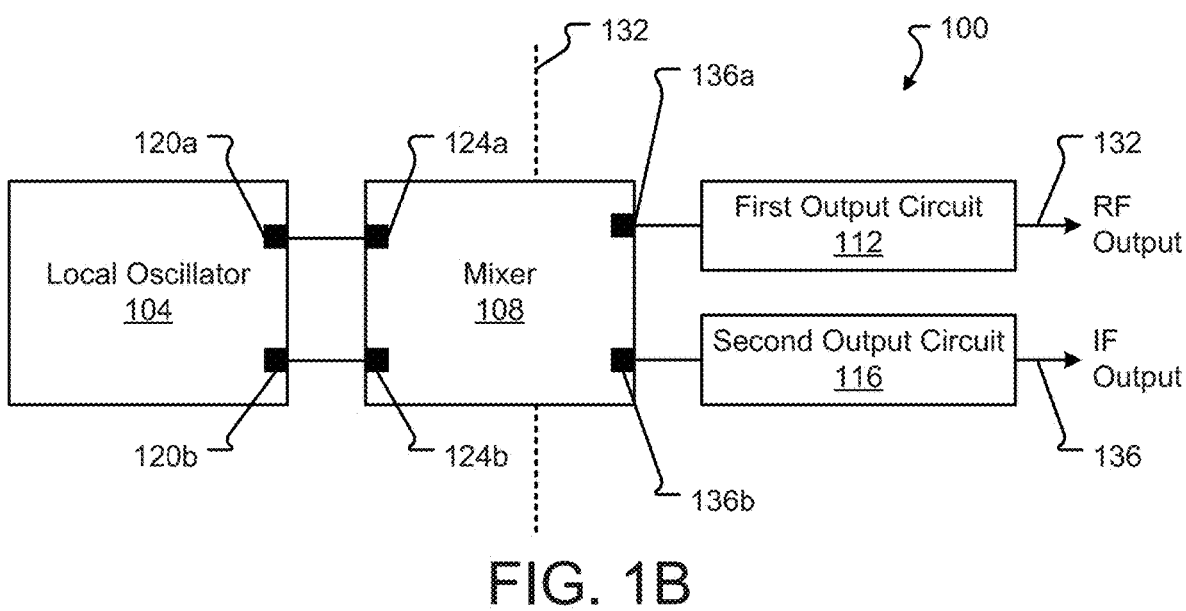
FIG. 1B is a block diagram illustrating an alternative configuration of a system according to at least some embodiments of the present disclosure.

With reference now to FIGS. 1A and 1B, an illustrative system 100 will be described in accordance with at least some embodiments of the present disclosure. The system 100 may be used for processing signals. The system 100 is shown to include a local oscillator 104, a mixer 108, a first output circuit 112, and a second output circuit 116. The mixer 108 may be configured to carry signal(s) generated by the local oscillator 104 to one or both of the first output circuit 112 and second output circuit 116. The mixer 108 may also be configured to provide an isolation barrier 132 between the local oscillator 104 and one or both of the first output circuit 112 and second output circuit 116.

The local oscillator 104 is depicted to include a first output terminal 120a and a second output terminal 120b. In some embodiments, the local oscillator 104 provides a differential output across the mixer 108. Specifically, and without limitation, a first signal transmitted on the first output terminal 120a may be equal in magnitude to a second signal transmitted on the second output terminal 120b, but the second signal may be a negative version of the first signal.

At lower frequencies, it may be possible to generate a differential output at the local oscillator 104, using efficient amplifiers (e.g., inverters). On the other hand, it may be more difficult to integrate a passive balun at frequencies below 500 MHz due to size and Q limiting factors. Having a differential local oscillator 104 preserves the L-R isolation of a singly balanced mixer 108. In embodiments where the mixer 108 comprises two or more FETs, it may be beneficial to ensure that the two or more FETs generate IFs that are in phase with one another and that can be combined together. If the mixer 108 includes two FETs with out-of-phase Los, the IF signals produced by the mixer 108 would also be out-of-phase.

As will be discussed in further detail herein, the mixer 108 may include two or more FETs in a FET pair (e.g., an NMOS and PMOS pair). The mixer 108 may be configured to switch the FETs in the FET pair in synchronization to ensure that the IFs produced by the FET pair are in phase. In such an approach, the RF and IF components can be extracted by the first output circuit 112 and second output circuit 116, respectively. Using such an approach, the RF and IF are extracted (and separated) from a single node 128 by a diplexer filter. In such an embodiment, the first output circuit 112 and second output circuit 116 may both be single-ended. At lower frequencies, the diplexer may be implemented externally, using discrete components.

As illustrated in FIG. 1A, the mixer 108 may be provided with two inputs 124a, 124b. A first input 124a of the mixer 108 may be connected to the first output 120a of the local oscillator and a second input 124b of the mixer 108 may be connected to the second output 120b. In this configuration, the mixer 108 may be considered to have its inputs 124a, 124b connected across the local oscillator 104.

The mixer 108 of FIG. 1A is further illustrated to include a single output 128. Both the first output circuit 112 and second output circuit 116 may be connected to the single output 128. In this configuration, the RF component and IF component may be extracted from the single output 128 of the mixer 108. The first output circuit 112 may be configured to extract the RF component of the mixer 108 output, then provide an RF output 132. Similarly, the second output circuit 116 may be configured to extract the IF component of the mixer 108 output, then provide an IF output 136. The RF output 132 may be transmitted on a first transmission medium (e.g., a first wire, line, or cable) and the IF output 136 may be transmitted on a second transmission medium (e.g., a second wire, line, or cable). In some embodiments, the RF output 132 and IF output 136 may be transmitted on different lines of a twisted pair cable.

The system 100 may correspond to a communication system in which the RF output 132 and IF output 136 are communicated across a communication network to a remote location. In some embodiments, the system 100 may be used to carry MRI signals from an MRI machine to an MRI control panel or terminal work station.

The system 100 may also be provided with a configuration such as the one illustrated in FIG. 1B. More specifically, the system 100 may be configured with a mixer 108 that includes two output 136a, 136b instead of a single output 128. In some embodiments, the mixer 108 may be configured to include a first input 124a, a second input 124b, a first output 136a, and a second output 136b. The first output circuit 112 may be connected directly to the first output 136a while the second output circuit 116 may be connected directly to the second output 136b. The mixer 108 may still be configured to provide an isolation barrier 132 between the local oscillator 104 and the output circuits 11, 116.

In either configuration of the system 100 (e.g., as depicted in FIG. 1A or 1B), the mixer 108 may be configured as a single-ended balanced mixer 108 or a double-ended balanced mixer 108 that provides isolation. As will be discussed in further detail, the mixer 108 can provide isolation capabilities without requiring an RF transformer or the like.

Figure 2:
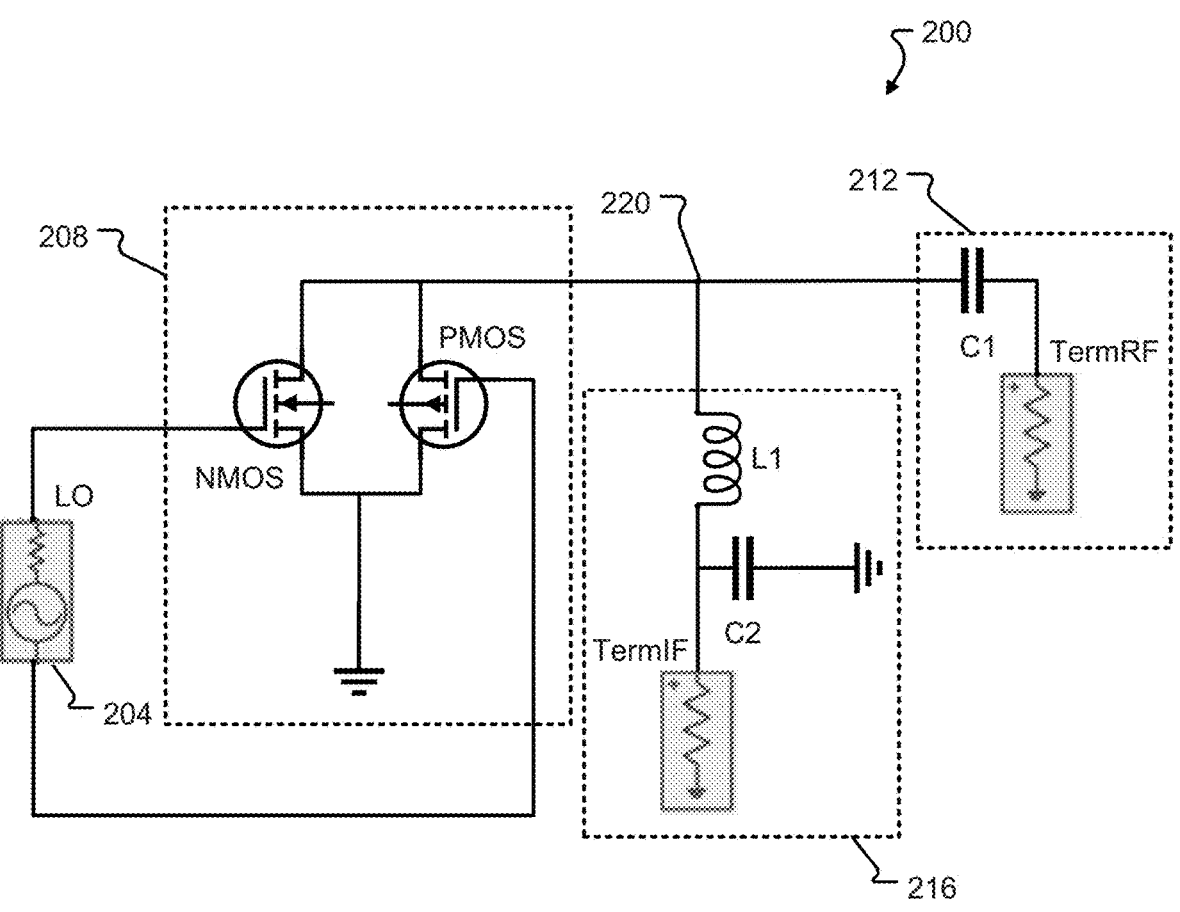
FIG. 2 is a diagram illustrating a circuit according to at least some embodiments of the present disclosure.

Referring now to FIG. 2, additional details of a circuit 200 in which a single-ended balanced mixer is used will be described in accordance with at least some embodiments of the present disclosure. The circuit 200 may be provided as part of a system 100 without departing from the scope of the present disclosure. In some embodiments, the circuit 200 may include a local oscillator 204, mixer circuitry 208, terminal RF output circuitry 212, and terminal IF output circuitry 216.

The local oscillator 204 may be similar or identical to the local oscillator 104 depicted and described in connection with FIGS. 1A and 1B. The local oscillator 204 may be configured to generate a differential output signal. In some embodiments, the local oscillator 204 may produce a differential output in the form of a square wave, a sawtooth wave, a sinusoidal wave, or the like.

The mixer circuitry 208 is illustrated to include a pair of FETs in the form of one NMOS transistor and one PMOS transistor. The FETs may be switched in synchronization with one another to have an IF that are in phase with one another. In some embodiments, a source of the NMOS transistor and a source of the PMOS transistor are connected to one another. In some embodiments, a drain of the NMOS transistor and a drain of the PMOS transistor are connected to one another. In some embodiments, a gate of the NMOS transistor is connected to a first side of the local oscillator 204 whereas a gate of the PMOS transistor is connected to a second side of the local oscillator 204. In this configuration, the FETs may be connected across the local oscillator 204. Synchronization between the FETs may be possible because the local oscillator 204 produces a differential output signal and because the FETs are switched in synchronization with one another.

Although the mixer circuitry 208 is depicted as containing a pair of FETs, including an NMOS transistor and a PMOS transistor, it should be appreciated that any switching component or collection of components can be utilized for one or both of the FETs without departing from the scope of the present disclosure.

The mixer 208 comprises a single output 220 to which both the terminal RF output circuitry 212 and terminal IF output circuitry 216 are connected. The terminal RF output circuitry 212 may be similar or identical to the first output circuit 112. The terminal IF output circuitry 216 may be similar or identical to the second output circuit 116.

The terminal RF output circuitry 212 may include a first capacitor C1 connected in series with a resistor. The terminal RF output circuitry 212 may include an RF output TermRF. The RF output signal 132 may be transmitted by the RF output TermRF.

The terminal IF output circuitry 216 may include an inductor L1, a second capacitor C2, ground, and an IF output TermIF. The input of the terminal RF output circuitry 212 and the input of the terminal IF output circuitry 216 are both connected to the single output terminal 220 of the mixer circuitry 216. The single output terminal 220 may be similar or identical to the output 128 illustrated in FIG. 1A. The RF components of the output produced by the mixer circuitry 208 are extracted by the terminal RF output circuitry 212. The IF components of the output produced by the mixer circuitry 208 are extracted by the terminal IF output circuitry 216. In some embodiments, the RF and IF components are extracted (and separated) from the single node 220 by a diplexer filter. In the illustrated configuration, both the terminal RF output circuitry 212 and the terminal IF output circuitry 216 are single-ended. At lower frequencies, a diplexer may be implemented externally, using discrete components.

Advantageously, there is no need for a balun in the circuit 200. Furthermore, both the terminal RF output circuitry 212 and the terminal IF output circuitry 216 are constructed entirely of passive circuit components. This greatly reduces the overall complexity of the circuit 200, without sacrificing performance. The use of passive circuit components is made possible by intelligently connecting the mixer circuitry 208 across the local oscillator 204 and by switching the FETs in synchronization with one another.

Figure 3:
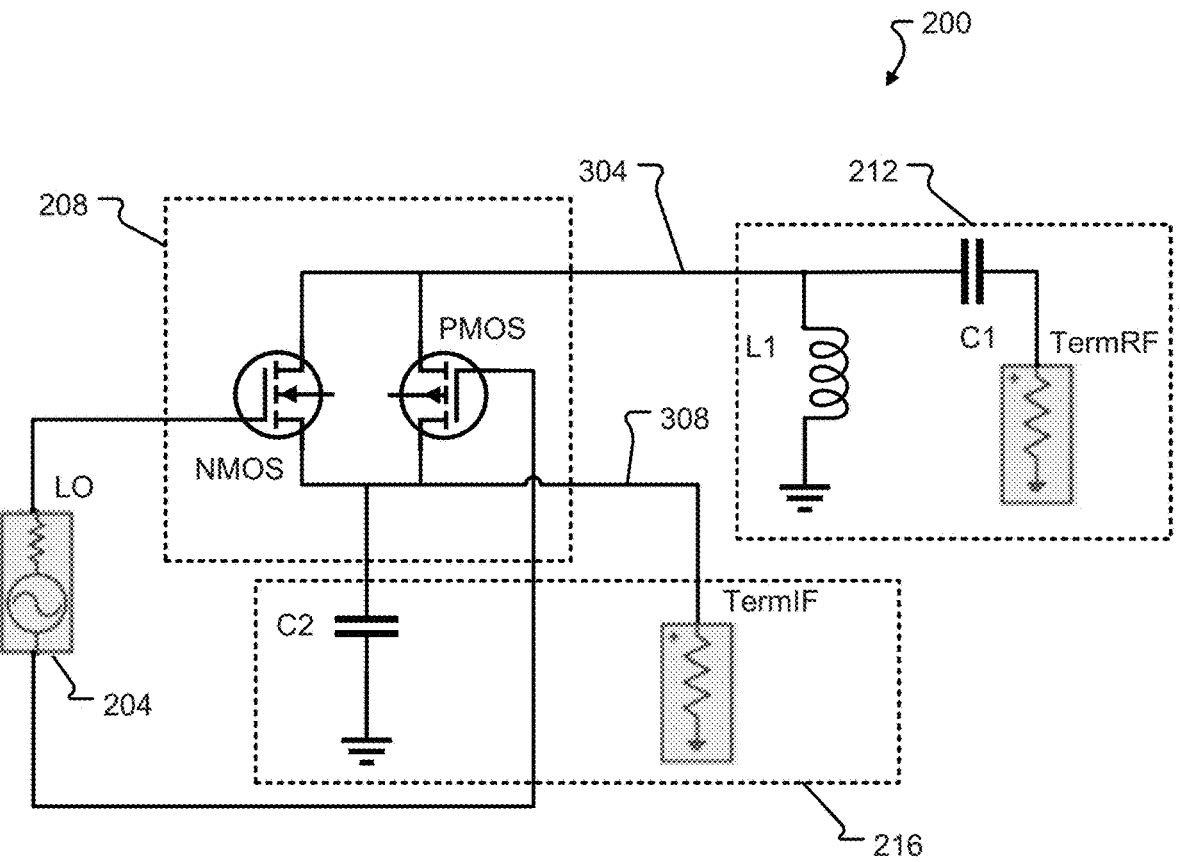
FIG. 3 is a diagram illustrating an alternative configuration of a circuit according to at least some embodiments of the present disclosure.

Referring now to FIG. 3, an alternative configuration of the circuit 200 will be described in accordance with at least some embodiments of the present disclosure. The circuit 200 of FIG. 3 is similar to the circuit 200 of FIG. 2 except that the mixer circuitry 208 is provided as a double-ended balanced mixer configuration.

More specifically, the circuit 200 of FIG. 3 includes the same components as the circuit 200 of FIG. 3 (e.g., local oscillator 204, mixer circuitry 208, terminal RF output circuitry 212, and terminal IF output circuitry 216. This particular configuration, however, connects the terminal RF output circuitry 212 to a first output terminal 304 of the mixer circuitry 208 while the terminal IF output circuitry 216 is connected to a second output terminal 308 of the mixer circuitry 208. In this particular configuration, the RF components and IF components are extracted from the FET pair on different sides of the mixer circuitry 208.

The other difference between the configurations of the circuit 200 illustrated in FIGS. 2 and 3 is that the circuit 200 according to FIG. 3 includes the inductor L1 within the terminal RF output circuitry 212. Also in this configuration, the second output terminal 308 of the mixer circuitry 208 is taken from the shared source of the FET pair.

Figure 4:
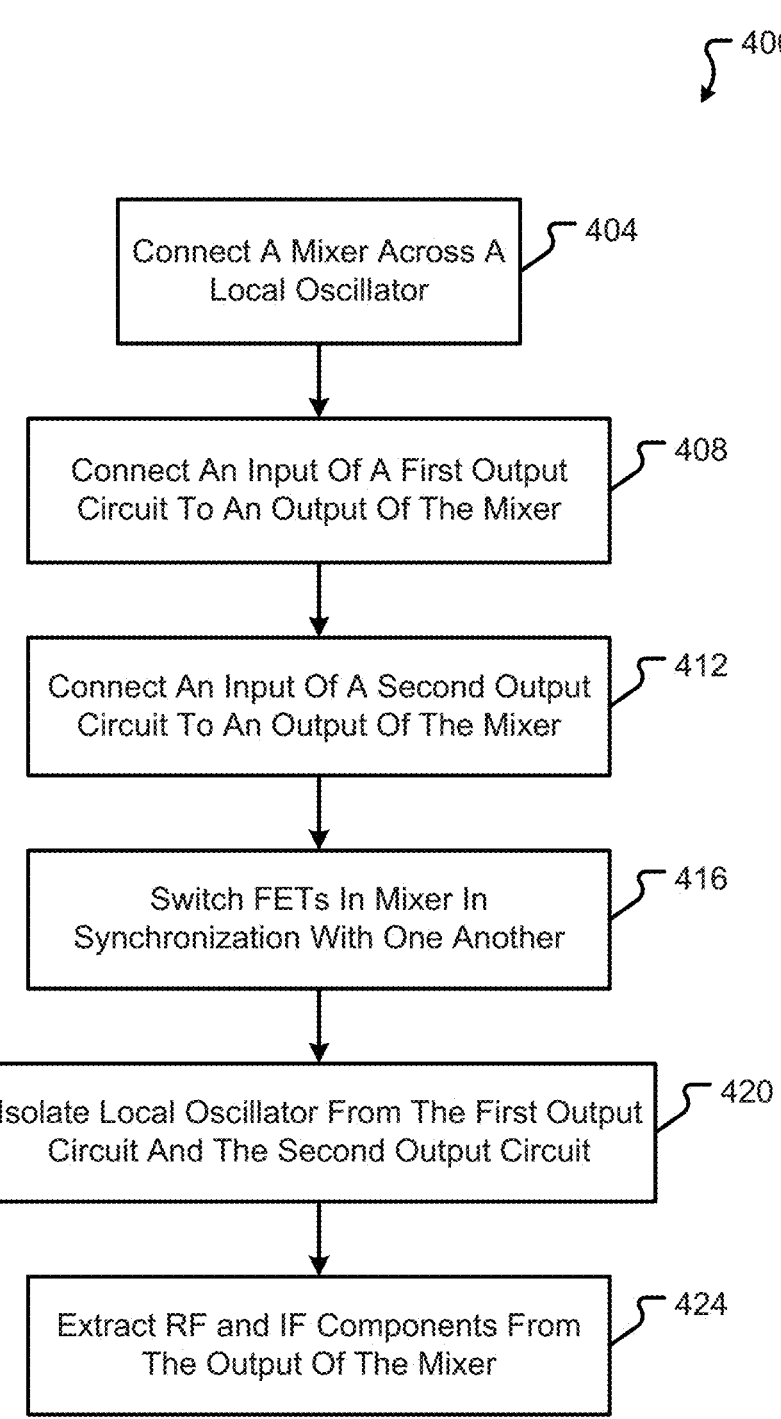
FIG. 4 is a flow diagram depicting a process for responding to a short-circuit event in accordance with embodiments of the present disclosure.

Referring now to FIG. 4, a method 400 will be described in accordance with at least some embodiments of the present disclosure. The method 400 begins by connecting a mixer across a local oscillator (step 404). The mixer may correspond to mixer 108 and/or to mixer circuitry 208. The local oscillator may correspond to local oscillator 104 and/or local oscillator 204.

The method 400 continues by connecting an input of a first output circuit to an output of the mixer (step 408). The first output circuit may correspond to the first output circuit 112 and/or to the terminal RF output circuitry 212.

The method 400 continues by connecting an input of a second output circuit to an output of the mixer (step 412). The second output circuit may correspond to the second output circuit 116 and/or to the terminal IF output circuitry 216. The second output circuit may be connected to the mixer at the same node as the first output circuit or the second output circuit may be connected to the mixer at a different node than the first output circuitry.

The method 400 continues by switching two or more FETs (or similar switching circuitry) in the mixer in synchronization with one another (step 416). Concurrent with step 416, the method 400 may also include isolating the local oscillator from the first output circuit and/or the second output circuit (step 420).

The method 400 may continue with the mixer and output circuits cooperating with one another to extract the RF and IF components from the output of the mixer (step 424). The RF and IF components may be extracted and separated from one another, then transmitted across a communication medium (e.g., wires). Alternatively or additionally, the RF and IF components may be transmitted wirelessly using an antenna and corresponding driver for the same.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A circuit, comprising:

mixer circuitry comprising multiple inputs and at least one output, wherein the multiple inputs are connected across a local oscillator, wherein the mixer circuitry further comprises a pair of Field Effect Transistors including a NMOS transistor and a PMOS transistor, and wherein a drain of the NMOS transistor and a drain of the PMOS transistor are connected to one another and coincide with ground;

terminal Radio Frequency (RF) output circuitry that is isolated from the local oscillator, wherein the at least one output of the mixer circuitry is directly connected to an input of the terminal RF output circuitry; and terminal Intermediate Frequency (IF) output circuitry that is isolated from the local oscillator, wherein the at least one output of the mixer circuitry is directly connected to an input of the terminal IF output circuitry.

2. The circuit of claim 1, wherein the at least one output comprises a single output and wherein both the input of the terminal RF output circuitry and the input of the terminal IF output circuitry are connected to the single output.

3. The circuit of claim 2, wherein the terminal RF output circuitry comprises a capacitor and a resistor.

4. The circuit of claim 2, wherein the terminal IF output circuitry comprises an inductor and a resistor.

5. The circuit of claim 2, wherein the terminal RF output circuitry is constructed entirely of passive components.

6. The circuit of claim 2, wherein the terminal IF output circuitry is constructed entirely of passive components.

7. The circuit of claim 1, wherein the pair of Field Effect Transistors (FETs) are switched in synchronization with one another and each generate an Intermediate Frequency (IF) that are in phase with one another.

8. The circuit of claim 7, wherein a source of the NMOS transistor and a source of the PMOS transistor are connected to one another, wherein a gate of the NMOS transistor is connected to a first side of the local oscillator, and wherein a gate of the PMOS transistor is connected to a second side of the local oscillator.

9. The circuit of claim 1, wherein the mixer circuitry comprises a diplexer filter.

10. A system, comprising:

a local oscillator;

a mixer comprising a first input, a second input, and at least one output, wherein the first input and the second input are both connected to the local oscillator, wherein the mixer further comprises a pair of Field Effect Transistors (FETs) including a first transistor and a second transistor, and wherein a drain of the first transistor and a drain of the second transistor are connected to one another and coincide with ground; and one or more output circuits connected to the at least one output of the mixer, wherein the one or more output circuits are isolated from the local oscillator, and wherein the one or more output circuits extract one or both of Radio Frequency (RF) components and Intermediate Frequency (IF) components from the at least one output of the mixer.

11. The system of claim 10, wherein the first input of the mixer is connected to a first terminal of the local oscillator and wherein the second input of the mixer is connected to a second terminal of the local oscillator.

12. The system of claim 10, wherein the at least one output of the mixer comprises a single output and wherein the one or more output circuits extract both the RF components and the IF components from the single output.

13. The system of claim 10, wherein the first transistor and the second transistor are switched in synchronization with one another and each generate an Intermediate Frequency (IF) that are in phase with one another.

14. The system of claim 10, wherein the one or more output circuits comprises a capacitor and a resistor.

15. The system of claim 10, wherein the one or more output circuits comprises an inductor and a resistor.

16. The system of claim 10, wherein the one or more output circuits is constructed entirely of passive components.

17. A method, comprising:

connecting a mixer across a local oscillator, wherein the mixer comprises a pair of Field Effect Transistors (FETs), and wherein a drain of each FET of the pair of FETs is connected to one another and coincides with ground;

connecting a first output circuit directly to an output of the mixer;

connecting a second output circuit directly to the output of the mixer;

enabling the first output circuit to extract Radio Frequency (RF) components from the output of the mixer;

enabling the second output circuit to extract Intermediate Frequency (IF) components from the output of the mixer; and isolating both the first output circuit and the second output circuit from the local oscillator using passive components.

18. The method of claim 17, further comprising:

switching the pair of FETs in synchronization with one another so that Intermediate Frequencies (IFs) generated by the pair of FETs are in phase with one another.

19. The method of claim 17, wherein the first output circuit comprises a capacitor and a resistor.

20. The method of claim 17, wherein at least one of the first output circuit and the second output circuit is constructed entirely of passive components.

* * * * *